US010308555B2

(12) United States Patent
Liu et al.

(10) Patent No.: US 10,308,555 B2
(45) Date of Patent: Jun. 4, 2019

(54) WAVE-ABSORBING MATERIALS AND METHODS FOR PREPARING THE SAME

(71) Applicant: BYD COMPANY LIMITED, Shenzhen, Guangdong (CN)

(72) Inventors: Houyin Liu, Shenzhen (CN); Xianjun Kong, Shenzhen (CN); Dajun Chen, Shenzhen (CN)

(73) Assignee: BYD COMPANY LIMITED, Shenzhen (CN)

(*) Notice: Subject to any disclaimer, the term of this patent is extended or adjusted under 35 U.S.C. 154(b) by 497 days.

(21) Appl. No.: 15/064,504

(22) Filed: Mar. 8, 2016

(65) Prior Publication Data

US 2016/0185669 A1  Jun. 30, 2016

Related U.S. Application Data

(63) Continuation of application No. PCT/CN2014/085053, filed on Aug. 22, 2014.

(30) Foreign Application Priority Data

Sep. 25, 2013  (CN) .......................... 2013 1 0441214

(51) Int. Cl.

| | |
|---|---|
| *H01F 1/34* | (2006.01) |
| *H01F 1/36* | (2006.01) |
| *H05K 9/00* | (2006.01) |
| *B28B 17/00* | (2006.01) |
| *C04B 35/01* | (2006.01) |
| *C04B 35/26* | (2006.01) |
| *C04B 35/64* | (2006.01) |
| *H01F 41/02* | (2006.01) |
| *C04B 35/053* | (2006.01) |
| *C04B 35/453* | (2006.01) |
| *C04B 35/626* | (2006.01) |

(52) U.S. Cl.
CPC ...... *C04B 35/2625* (2013.01); *B28B 17/0009* (2013.01); *C04B 35/016* (2013.01); *C04B 35/053* (2013.01); *C04B 35/26* (2013.01); *C04B 35/453* (2013.01); *C04B 35/6261* (2013.01); *C04B 35/64* (2013.01); *H01F 1/344* (2013.01); *H01F 1/36* (2013.01); *H01F 41/0246* (2013.01); *H05K 9/0075* (2013.01); *H05K 9/0083* (2013.01); *C04B 2235/3206* (2013.01); *C04B 2235/3229* (2013.01); *C04B 2235/3239* (2013.01); *C04B 2235/3251* (2013.01); *C04B 2235/3256* (2013.01); *C04B 2235/3262* (2013.01); *C04B 2235/3284* (2013.01); *C04B 2235/3298* (2013.01); *C04B 2235/34* (2013.01); *C04B 2235/3418* (2013.01); *C04B 2235/602* (2013.01); *C04B 2235/6022* (2013.01); *C04B 2235/6025* (2013.01); *C04B 2235/6562* (2013.01); *C04B 2235/6567* (2013.01); *C04B 2235/661* (2013.01)

(58) Field of Classification Search
CPC ... H01F 1/344; H05K 9/0075; C04B 35/2625; C04B 2235/3206; C04B 2235/3229; C04B 2235/3239; C04B 2235/3251; C04B 2235/3256; C04B 2235/3262; C04B 2235/3272; C04B 2235/3284; C04B 2235/3298; C04B 2235/3427; C04B 2235/34
See application file for complete search history.

(56) References Cited

U.S. PATENT DOCUMENTS

| | | |
|---|---|---|
| 6,391,222 B1 | 5/2002 | Watanabe |
| 2004/0130429 A1 | 7/2004 | Watanabe et al. |

FOREIGN PATENT DOCUMENTS

| | | |
|---|---|---|
| CN | 1294099 A | 5/2001 |
| CN | 1514450 A | 7/2004 |
| CN | 1547234 A | 11/2004 |
| CN | 1651353 A | 8/2005 |
| CN | 1814839 A | 8/2006 |
| CN | 102173762 A | 9/2011 |
| CN | 102211929 A | 10/2011 |
| EP | 0891955 A1 | 1/1999 |
| EP | 2277838 A1 | 1/2011 |
| JP | H 11-79785 A | 3/1999 |
| JP | 2005-228939 A | 8/2005 |
| JP | 2010-248031 A | 11/2010 |
| WO | WO 2015/043347 A1 | 4/2015 |

OTHER PUBLICATIONS

PCT International Search Report and Written Opinion dated Nov. 26, 2014, issued in corresponding International Application No. PCT/CN2014/085053 (13 pages).

*Primary Examiner* — C Melissa Koslow
(74) *Attorney, Agent, or Firm* — Anova Law Group, PLLC

(57) ABSTRACT

Embodiments of the present disclosure are drawn to a wave-absorbing material that includes a main composition, an auxiliary composition, and a sintering additive. The main composition includes at least one of $Fe_2O_3$, MnO, ZnO, and MgO. The auxiliary composition includes at least one of $CeO_2$ and $P_2O_5$. The molar ratio of $CeO_2$ to $P_2O_5$ ranges from about 1:1 to about 2:1. A method for preparing the wave-absorbing material is also provided.

19 Claims, 1 Drawing Sheet

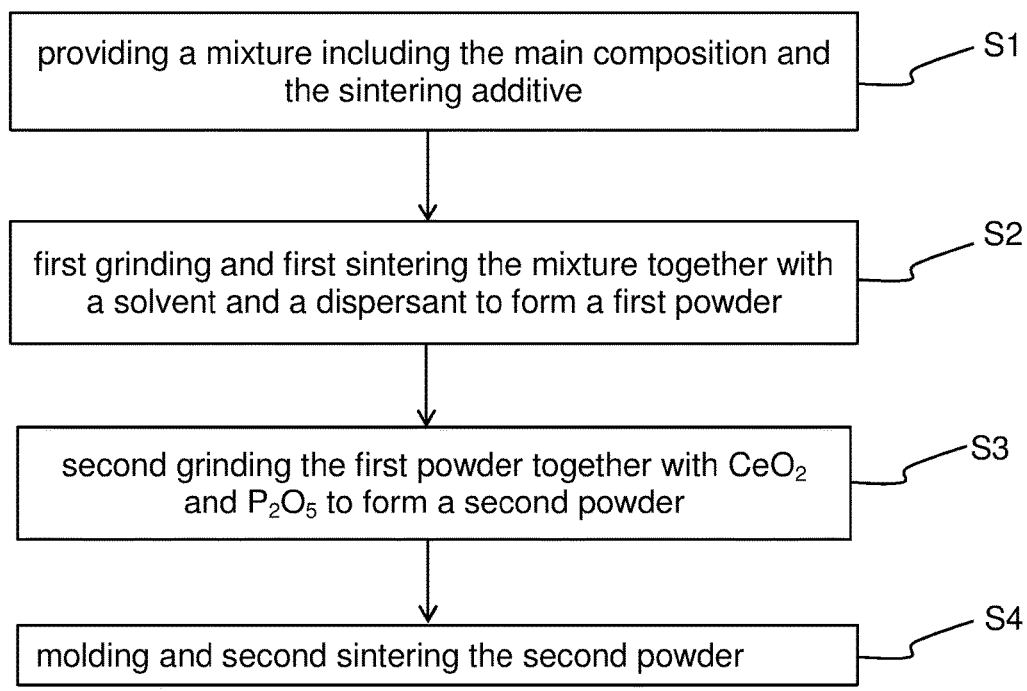

WAVE-ABSORBING MATERIALS AND METHODS FOR PREPARING THE SAME

CROSS-REFERENCE TO RELATED APPLICATIONS

This application is a continuation of International Application No. PCT/CN2014/085053, filed Aug. 22, 2014, which claims priority to, and benefits of Chinese Patent Application No. 201310441214.8, filed with the State Intellectual Property Office of P.R. China on Sep. 25, 2013. The entire contents of the above-referenced applications are incorporated herein by reference in their entirety.

TECHNICAL FIELD

The present disclosure relates to magnetic materials, and more particularly to wave-absorbing materials and methods for preparing the wave-absorbing materials.

BACKGROUND

A receiving terminal in a wireless charging system that uses electromagnetic induction may include a magnetic disk that may absorb electromagnetic waves entering into the material of the receiving terminal, which may prevent the electromagnetic wave from interfering with the electromagnetic signals of the receiving terminal, and/or prevent the electromagnetic waves from generating heat in components of the receiving terminal, e.g., batteries and etc. Currently, composite materials, such as a composite material made from an Al—Si—Fe alloy and a resin, are used for making the magnetic disk. However, the particles of the Al—Si—Fe alloy need to have a uniform and fixed shape, and the arrangement of the particles in the resin need to be aligned in accordance with a certain orientation; otherwise, the initial magnetic permeability of the composite material can be very low. Even if the arrangement of the particles in the resin are aligned along a desirable orientation, the initial magnetic permeability of the composite material may not be high due to the existence of an amount of resin. Moreover, the resistivity of the composite material may be relatively high because of the existence of metals. These disadvantages may lead to a low efficiency and poor safety of the wireless charging system, and more pronounced electromagnetic heating effect on the components of the receiving terminal, such as the battery.

Chinese Patent Application No. CN 102211929 A discloses a NiCuZn ferrite material that is sintered at a low temperature and has high magnetic permittivity. The Ni—Cu—Zn ferrite material contains a main composition selected from the group consisting of $Fe_2O_3$, ZnO, CuO, and NiO, and an auxiliary composition selected from the group consisting of $NaCO_3$, $B_2O_3$, and $Ta_2O_5$. Among the oxide components in the main composition, $Fe_2O_3$, ranges from 40.5 mol % to 49.6 mol %; ZnO, ranges from 30 mol % to 47 mol %; CuO ranges from 5 mol % to 20 mol %; and the remaining of the oxide components is NiO. Based on the total weight of the main composition, the sum of the auxiliary composition ranges from 0.16 wt % to 1.65 wt %. The NiCuZn ferrite material has a relatively high magnetic conductivity, but the material has a relatively high magnetic loss.

SUMMARY

Embodiments of the present disclosure seek to solve at least one of the problems set forth above and/or other problems of existing materials for absorbing electromagnetic waves.

According to a first aspect of the present disclosure, a wave-absorbing material is provided. The wave-absorbing material includes a main composition including $Fe_2O_3$, MnO, ZnO, and MgO, an auxiliary composition including $CeO_2$ and $P_2O_5$, and a sintering additive, in which the molar ratio of $CeO_2$ to $P_2O_5$ ranges from about 1:1 to about 2:1.

According to a second aspect of the present disclosure, a method for preparing the wave-absorbing material is provided. The method includes providing a mixture including the main composition and the sintering additive, first grinding and first sintering the mixture together with a solvent and a dispersant to form a first powder, second grinding the first powder together with $CeO_2$ and $P_2O_5$ to form a second powder, and molding and second sintering the second powder.

According to embodiments of the present disclosure, the wave-absorbing material includes $CeO_2$ and $P_2O_5$, and the molar ratio of $CeO_2$ to $P_2O_5$ ranges from about 1:1 to about 2:1. The $CeO_2$ and $P_2O_5$ may have a synergistic effect on each other, and therefore the resistivity and/or the initial magnetic permeability of the wave-absorbing material may be improved. In addition, the magnetic loss of the wave-absorbing material may be decreased to a lower level, which may increase the charging efficiency of a device using this wave-absorbing material.

Additional aspects and advantages of embodiments of present disclosure will be given in part in the following descriptions, become apparent in part from the following descriptions, and/or be learned from the practice of the embodiments of the present disclosure. The objects and advantages of the present disclosure will be realized and attained by means of the elements and combinations particularly pointed out in the appended claims.

It is to be understood that the present disclosure is not limited in its application to the details of construction and to the arrangements of the materials and methods set forth in the following description. The present disclosure is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be used as a basis for designing other materials and methods for carrying out the several purposes of the present disclosure. It is important, therefore, to recognize that the claims should be regarded as including such equivalent constructions insofar as they do not depart from the spirit and scope of the present disclosure.

BRIEF DESCRIPTION OF THE DRAWINGS

The accompanying drawings, which are incorporated in and constitute a part of this specification, illustrate exemplary embodiments of the present disclosure, and, together with the description, serve to explain the principles of the disclosure.

FIG. 1 depicts a flow chart illustrating a method for preparing a wave-absorbing material according to embodiments of the present disclosure.

DETAILED DESCRIPTION

Reference will be made in detail to embodiments of the present disclosure, examples of which are illustrated in the accompanying drawings. The embodiments described herein with reference to drawings are explanatory, illustrative, and used to generally understand the present disclosure. Unless otherwise defined, technical and/or scientific terms have the meaning commonly understood by one of ordinary skill in the art. The disclosed embodiments are described in sufficient detail to enable those skilled in the art to practice the disclosed embodiments. It is to be understood that other embodiments may be utilized and that changes may be made without departing from the scope of the disclosed embodiments. The disclosed embodiments shall not be construed to limit the present disclosure.

While the present disclosure is described herein with reference to illustrative embodiments of particular applications, such as wave-absorbing materials and methods for preparing the wave-absorbing materials, it is understood that the embodiments described herein are not limited thereto. Those having ordinary skill in the art and access to the teachings provided herein will recognize additional modifications, applications, embodiments, and substitution of equivalents that all fall within the scope of the present disclosure.

In addition, terms such as "first" and "second" are used herein for purposes of description and are not intended to indicate or imply relative importance or significance.

For the purpose of the present description and of the following claims, the definitions of the numerical ranges always include the extremes unless otherwise specified.

According to a first aspect of the present disclosure, a wave-absorbing material is provided. The wave-absorbing material includes a main composition, an auxiliary composition, and a sintering additive. The main composition contains ferric oxide (i.e., $Fe_2O_3$), manganese oxide (MnO), zinc oxide (ZnO), and magnesium oxide (MgO). The auxiliary composition includes cerium dioxide ($CeO_2$) and phosphorus pentoxide ($P_2O_5$). The molar ratio of $CeO_2$ to $P_2O_5$ ranges from about 1:1 to about 2:1.

According to some embodiments of the present disclosure, the wave-absorbing material includes $CeO_2$, which belongs to lanthanide metal oxides and has a high melting point. The $CeO_2$ may refine the grain, increase the resistivity and the initial magnetic permeability, and/or reduce eddy current loss of the wave-absorbing material. Additionally or alternatively, the wave-absorbing material may include a nonmetallic oxide $P_2O_5$. The $P_2O_5$ may increase the vacancy of metal ions near the grain boundary, accelerate the movement of the grain boundary, and increase the density and/or the initial magnetic permeability of the wave-absorbing material. According to embodiments of the present disclosure, $CeO_2$ and $P_2O_5$ may both be included in the wave-absorbing material, and the molar ratio of $CeO_2$ to $P_2O_5$ may range from about 1:1 to about 2:1. Then $CeO_2$ and $P_2O_5$ may have a synergistic effect, and the resistivity and the initial magnetic permeability of the wave-absorbing material may both be increased. In addition, the magnetic loss of the wave-absorbing material may be decreased to a very low level, which may substantially increase the charging efficiency of a device using this wave-absorbing material.

According to some embodiments of the present disclosure, of the total molar amount of the wave-absorbing material, $Fe_2O_3$ ranges from about 40 mol % to about 54 mol %, MnO ranges from about 12 mol % to about 20 mol %, ZnO ranges from about 22 mol % to about 25 mol %, MgO ranges from about 5 mol % to about 10 mol %, $CeO_2$ ranges from about 0.1 mol % to about 3.5 mol %, $P_2O_5$ ranges from about 0.1 mol % to about 2.5 mol %, and/or the sintering additive ranges from about 0.2 mol % to about 3.5 mol %.

According to some embodiments of the present disclosure, of the total molar amount of the wave-absorbing material, $Fe_2O_3$ ranges from about 45 mol % to about 50 mol %, MnO ranges from about 13 mol % to about 16 mol %, ZnO ranges from about 22 mol % to about 25 mol %, MgO ranges from about 5 mol % to about 10 mol %, $CeO_2$ ranges from about 1.5 mol % to about 3.0 mol %, $P_2O_5$ ranges from about 1 mol % to about 2 mol %, and/or the sintering additive ranges from about 0.2 mol % to about 3.5 mol %.

According to some embodiments of the present disclosure, the sintering additive may reduce the sintering temperature for the wave-absorbing material, and therefore allowing the magnetic disk may undergo a liquid phase sintering at a relatively lower temperature. Then the density and the intensity of the final wave-absorbing material may be both increased. In some embodiments, the sintering additive includes at least one of $Nb_2O_5$, $MoO_3$, $Bi_2O_3$, $V_2O_5$, and $SiO_2$.

According to some embodiments of the present disclosure, of the total molar amount of the wave-absorbing material, $Nb_2O_5$ ranges from about 0.1 mol % to about 2.5 mol %, $MoO_3$ ranges from about 0.1 mol % to about 1.5 mol %, $Bi_2O_3$ ranges from about 0.2 mol % to about 1.5 mol %, $V_2O_5$ ranges from about 0.1 mol % to about 1.5 mol %, and/or $SiO_2$ ranges from 0.2 mol % to about 2.5 mol %.

In some embodiments of the present disclosure, $Nb_2O_5$ may increase the thickness and resistivity of the grain boundary so as to increase the resistivity of the wave-absorbing material. Controlling the amount of $Bi_2O_3$ in the wave-absorbing material may allow performing liquid phase sintering to the wave-absorbing material. This may promote the growth of the grain, increase the density of the material, and reduce the porosity both outside and inside the grain. Selecting a suitable amount of $Bi_2O_3$ to be added to the wave-absorbing material may increase the initial magnetic permeability of the wave-absorbing material. Selecting a suitable small amount of $SiO_2$ powder to be added to the wave-absorbing material may dilute Fe, and thus may reduce the electrical conductivity of $Fe^{2+}$ and $Fe^{3+}$, which thus may increase the resistivity of the wave-absorbing material. $SiO_2$ powders have some additional advantages, such as good surface permeability, large surface area, low density, good mechanical property, and/or good thermostability. Adding $SiO_2$ powders to the wave-absorbing material may increase the strength of the wave-absorbing material. Adding $MoO_3$, $Bi_2O_3$, and/or $V_2O_5$ to the wave-absorbing material may reduce the sintering temperature needed, and may allow the wave-absorbing material to undergo a liquid phase sintering at a relatively lower temperature, which may increase the density and strength of the wave-absorbing material.

According to a second aspect of the present disclosure, a method for preparing the wave-absorbing material is provided. FIG. 1 depicts a flow chart illustrating the method for preparing a wave-absorbing material according to embodiments of the present disclosure. As shown in FIG. 1, the method includes steps S1-S4 as described below.

At step S1, a mixture including the main composition and the sintering additive is provided.

At step S2, the mixture is first grinded and first sintered together with a solvent and a dispersant to form a first powder.

At step S3, the first powder is second grinded together with $CeO_2$ and $P_2O_5$ to form a second powder.

At step S4, the second powder is molded and second sintered.

According to some embodiments of the present disclosure, the method includes one or more of the following steps: mixing the main composition with an auxiliary composition, e.g., the sintering additive, to form a first mixture, mixing the first mixture with a solvent and a dispersant to form a second mixture, wet-grinding and drying the second mixture to form a first powder, pre-sintering the first powder to obtain a pre-sintered first powder, mixing the pre-sintered first powder with $CeO_2$ and $P_2O_5$ to obtain a second powder, ball-milling and screening the second powder to obtain a third powder, and molding and sintering the third powder.

According to some embodiments of the present disclosure, the first grinding of step S2 is performed by wet grinding. The wet grinding is carried out at a grinding speed ranging from about 400 r/min to about 450 r/min for a period of time ranging from about 8 hours to about 12 hours.

According to some embodiments of the present disclosure, the method further includes drying the first grinded product at step S2. The drying is performed at a temperature ranging from about 60° C. to about 80° C. for a period of time ranging from about 10 hours to about 20 hours.

According to some embodiments of the present disclosure, the first sintering includes first heating the grinded product (dried grinded product, if a drying step is included) obtained from the first grinding step to a temperature ranging from about 700° C. to about 950° C. with a temperature increasing rate ranging from about 3° C./min to about 5° C./min, and maintaining the heated product obtained from the first heating step at a temperature ranging from about 700° C. to about 950° C. for a period of time ranging from about 1 hour to about 4 hours. In some embodiments, the method further includes cooling the first sintered product.

According to some embodiments of the present disclosure, the second grinding of step S2 is performed by ball-milling. The ball-milling may be performed at a grinding speed ranging from about 300 r/min to about 450 r/min for a period of time ranging from about 4 hours to about 10 hours.

According to some embodiments of the present disclosure, the molding is performed by at least one of tape casting, coating, press molding, and injection molding.

According to some embodiments of the present disclosure, the second sintering includes second heating the sintered product obtained from the first sintering step to a temperature ranging from about 1000° C. to about 1150° C. with a temperature increasing rate ranging from about 0.5° C./min to 3° C./min, and maintaining the heated product obtained from the second heating step at the temperature ranging from about 1000° C. to about 1150° C. for a period of time ranging from about 2 hours to about 4 hours. In some embodiments, the method further includes cooling the second sintered product.

According to embodiments of the present disclosure, $CeO_2$ and $P_2O_5$ are added, e.g., to the second mixture, and the molar ratio of $CeO_2$ to $P_2O_5$ ranges from about 1:1 to about 2:1. The $CeO_2$ and $P_2O_5$ may have a synergistic effect, increasing the resistivity and the initial magnetic permeability of the wave-absorbing material. In addition, the magnetic loss of the wave-absorbing material may be decreased to a very low level, which may substantially increase the charging efficiency of a device using this wave-absorbing material.

As described herein, the wave-absorbing material may be used and/or prepared in the particular exemplary compositions described above and hereinafter, and may also be used/or prepared in other compositions including selected components without departing from the scope of the present disclosure.

The present disclosure will be described in detail below with reference to exemplary embodiments.

Embodiment 1 (E1)

The present embodiment E1 illustrates a wave-absorbing material and a method for preparing the wave-absorbing material.

The main composition and the sintering additive were mixed together to form a first mixture. Then the solvent and the dispersant were added into the first mixture to form a second mixture. The second mixture was grinded by wet grinding at a grinding speed of 450 r/min for 8 hours to obtain a first powder. Details of the composition and contents of the main composition, the sintering additive, the solvent, and the dispersant are shown in Table 1.

The first powder was placed in a vessel and dried in a dryer at 80° C. for 10 hours.

The dried powder were grinded and pre-sintered in a sintering furnace. The grinded powder was heated to 950° C. with a temperature increasing rate of 5° C./min, and then kept at 950° C. for 2 hours. Then the sintered powder was cooled together with the cooling of the sintering furnace.

The pre-sintered powder was mixed with $CeO_2$ and $P_2O_5$, ball-milled at a rotation speed of 400 r/min for 6 h, and screened to form a second powder.

The second powder was molded into a ring by press molding. The ring had an outer diameter of 20 mm, an inner diameter of 5 mm, and a height of 8 mm.

The molded product, i.e., the ring, was sintered to form an exemplary wave-absorbing material A1. First, the molded product was heated to 300° C. with a temperature increasing rate of 2° C./min, and then kept at 300° C. for 30 min. Second, the temperature was increased from 300° C. to 550° C. and the molded product was kept at 550° C. for 30 min. Third, the temperature was increased from 550° C. to 900° C. and the molded product was kept at 900° C. for 60 min. Fourth, the temperature was increased from 900° C. to 1100° C. and the molded product was kept at 1100° C. for 120 min. Finally, the sintered molded product was cooled together with the cooling of the sintering furnace.

Embodiments 2-7 (E2 to E7)

The methods for preparing exemplary wave-absorbing materials A2-A7 were substantially the same as that in Embodiment 1 with the exception that the content and/or compositions of the corresponding wave-absorbing materials were different as shown in Table 1.

Comparative Embodiments 1-3 (CE1 to CE3)

The methods for preparing wave-absorbing materials CA1-CA3 were substantially the same as that in Embodiment 1 with the exception that the content and/or compositions of the corresponding wave-absorbing materials were different as shown in Table 1.

Comparative Embodiment 4 (CE4)

A wave-absorbing material CA4 was prepared according to Embodiment 1 of CN102211929 A.

TABLE 1

Compositions and content of exemplary wave-absorbing materials in different embodiments

|  | E1 | E2 | E3 | E4 | E5 | E6 | E7 | CE1 | CE2 | CE3 |
|---|---|---|---|---|---|---|---|---|---|---|
| $Fe_2O_3$ | 1 | 1 | 1 | 1 | 1 | 1 | 1 | 1 | 1 | 1 |
| MnO | 0.3 | 0.36 | 0.3 | 0.3 | 0.3 | 0.3 | 0.3 | 0.3 | 0.3 | 0.3 |
| ZnO | 0.5 | 0.5 | 0.5 | 0.5 | 0.5 | 0.5 | 0.5 | 0.5 | 0.5 | 0.5 |
| MgO | 0.22 | 0.2 | 0.2 | 0.2 | 0.2 | 0.2 | 0.2 | 0.2 | 0.2 | 0.2 |
| $CeO_2$ | 0.04 | 0.06 | 0.04 | 0.05 | 0.05 | 0.077 | 0.002 | 0 | 0.04 | 0 |
| $P_2O_5$ | 0.02 | 0.04 | 0.03 | 0.04 | 0.05 | 0.055 | 0.002 | 0 | 0 | 0.04 |
| $Nb_2O_5$ | 0.02 | 0.02 | 0.02 | 0.02 | 0.02 | 0.02 | 0.02 | 0.02 | 0.02 | 0.02 |
| $MoO_3$ | 0.015 | 0.015 | 0.015 | 0.015 | 0.015 | 0.015 | 0.015 | 0.015 | 0.015 | 0.015 |
| $Bi_2O_3$ | 0.02 | 0.02 | 0.02 | 0.02 | 0.02 | 0.02 | 0.02 | 0.02 | 0.02 | 0.02 |
| $V_2O_5$ | 0.01 | 0.01 | 0.01 | 0.01 | 0.01 | 0.007 | 0.01 | 0.01 | 0.01 | 0.01 |
| $SiO_2$ | 0.01 | 0.01 | 0.01 | 0.01 | 0.01 | 0.007 | 0.01 | 0.01 | 0.01 | 0.01 |

Test results of the exemplary wave-absorbing materials are described below.

1) Initial Magnetic Permeability

The initial magnetic permeability was measured by using an HP4284A impedance analyzer commercially available from Aglient Technologies, Inc., US, and a special fixture 16454A. The pre-sintered powders to be tested were each molded into a hollow cylinder by press molding. The hollow cylinder had an outer diameter of 20 mm, an inner diameter of 5 mm, and a height of 8 mm. The cylinder was considered as a single-turn coil. The inductance of the coil was obtained by measuring its impedance, and then the initial magnetic permeability of the tested material was calculated. The testing frequency was 100 kHz. The results are shown in Table 2.

2) Resistivity

Resistivity was measured by using an RT-100 resistivity meter commercially available from Semilab company. The powders to be tested were each molded into a cube having a length ranging from 20 mm to 25 mm and a cross-section diagonal length ranging from 10 mm to 15 mm. The cube was tested using the resistivity meter, and then the resistivity was calculated according to the manual of the resistivity meter. The results are shown in Table 2.

TABLE 2

Test results of exemplary wave-absorbing materials

|  | Initial Magnetic Permeability | Resistivity ($\rho/\Omega \cdot m$) |
|---|---|---|
| A1 | 7000 | 4.75 |
| A2 | 12000 | 5.68 |
| A3 | 7200 | 4.55 |
| A4 | 7500 | 4.72 |
| A5 | 10000 | 5.63 |
| A6 | 9800 | 5.20 |
| A7 | 7010 | 4.80 |
| CA1 | 4200 | 2.51 |
| CA2 | 5500 | 4.33 |
| CA3 | 5400 | 4.98 |
| CA4 | 4000 | 2.30 |

It can be seen from Table 2 that the wave-absorbing materials, i.e., A1-A4, according to exemplary embodiments, e.g., E1-E7, of the present disclosure had not only higher initial magnetic permeability, but also higher resistivity. The wave-absorbing materials, i.e., CA1-CA4, prepared according to the Comparative Embodiments, i.e., CE1-CE4, had a high initial magnetic permeability, but they had relatively lower resistivity.

Reference throughout this specification to "an embodiment," "some embodiments," "one embodiment," "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment," "in an embodiment," "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

The many features and advantages of the present disclosure are apparent from the detailed specification, and thus, it is intended by the appended claims to cover all such features and advantages of the present disclosure that fall within the true spirit and scope of the present disclosure. Further, since numerous modifications and variations will readily occur to those skilled in the art, it is not desired to limit the present disclosure to the exact construction and operation illustrated and described, and accordingly, all suitable modifications and equivalents may be resorted to, falling within the scope of the present disclosure.

Moreover, those skilled in the art will appreciate that the conception upon which this disclosure is based may readily be used as a basis for designing other compositions, materials, systems, and methods for carrying out the several purposes of the present disclosure. Accordingly, the claims are not to be considered as limited by the foregoing description.

What is claimed is:

1. A wave-absorbing material comprising:
   a main composition comprising $Fe_2O_3$, MnO, ZnO, and MgO;
   an auxiliary composition comprising $CeO_2$ and $P_2O_5$, wherein a molar ratio of $CeO_2$ to $P_2O_5$ ranges from 1:1 to 2:1; and
   a sintering additive.

2. The wave-absorbing material of claim 1, wherein of a total molar amount of the wave-absorbing material, an amount of $Fe_2O_3$ ranges from 40 mol % to 54 mol %.

3. The wave-absorbing material of claim 1, wherein of a total molar amount of the wave-absorbing material, an amount of MnO ranges from 12 mol % to 20 mol %.

4. The wave-absorbing material of claim 1, wherein of a total molar amount of the wave-absorbing material, an amount of ZnO ranges from 22 mol % to 25 mol %.

5. The wave-absorbing material of claim 1, wherein of a total molar amount of the wave-absorbing material, an amount of MgO ranges from 5 mol % to 10 mol %.

6. The wave-absorbing material of claim 1, wherein of a total molar amount of the wave-absorbing material, an amount of $CeO_2$ ranges from 0.1 mol % to 3.5 mol %.

7. The wave-absorbing material of claim 1, wherein of a total molar amount of the wave-absorbing material, an amount of $P_2O_5$ ranges from 0.1 mol % to 2.5 mol %.

8. The wave-absorbing material of claim 1, wherein of a total molar amount of the wave-absorbing material, an amount of the sintering additive ranges from 0.2 mol % to 3.5 mol %.

9. The wave-absorbing material of claim 1, wherein the sintering additive is at least one selected from $Nb_2O_5$, $MoO_3$, $Bi_2O_3$, $V_2O_5$, and $SiO_2$.

10. The wave-absorbing material of claim 9, wherein of a total molar amount of the wave-absorbing material, an amount of $Nb_2O_5$ ranges from 0.1 mol % to 2.5 mol %, an amount of $MoO_3$ ranges from 0.1 mol % to 1.5 mol %, an amount of $Bi_2O_3$ ranges from 0.2 mol % to 1.5 mol %, an amount of $V_2O_5$ ranges from 0.1 mol % to 1.5 mol %, and an amount of $SiO_2$ ranges from 0.2 mol % to 2.5 mol %.

11. A method for preparing a wave-absorbing material, comprising:
providing a mixture comprising a main composition comprising $Fe_2O_3$, MnO, ZnO, and MgO, and a sintering additive;
first grinding and first sintering the mixture together with a solvent and a dispersant to form a first powder;
second grinding the first powder together with $CeO_2$ and $P_2O_5$ to form a second powder, wherein a molar ratio of $CeO_2$ to $P_2O_5$ ranges from 1:1 to 2:1; and
molding and second sintering the second powder.

12. The method of claim 11, wherein the first grinding is a wet grinding performed at a grinding speed ranging from 400 r/min to 450 r/min for a period of time ranging from 8 hours to 12 hours.

13. The method of claim 11, wherein the first sintering comprises:
first heating a grinded product obtained from the first grinding to a temperature ranging from 700° C. to 950° C. with a temperature increasing rate of about 3° C./min to 5° C./min;
maintaining the heated product obtained from the first heating at the temperature ranging from 700° C. to 950° C. for a period of time ranging from 1 hour to 4 hours.

14. The method of claim 11, wherein the second grinding is a ball-milling performed at a grinding speed ranging from 300 r/min to 450 r/min for a period of time ranging from 4 hours to 10 hours.

15. The method of claim 11, wherein the molding is performed by at least one of blade casting, coating, press molding, or injection molding.

16. The method of claim 11, wherein the second sintering comprises:
second heating a sintered product obtained from the first sintering to a temperature ranging from 1000° C. to 1150° C. with a temperature increasing rate ranging from 0.5° C./min to 3° C./min; and
maintaining the heated product obtained from the second heating at the temperature ranging from 1000° C. to 1150° C. for a period of time ranging from 2 hours to 4 hours.

17. The method of claim 11, further comprising screening the second powder before the molding.

18. The method of claim 11, further comprising drying a grinded product obtained from the first grinding before the first sintering.

19. The method of claim 18, wherein the drying is performed at a temperature ranging from 60° C. to 80° C. for a period of time ranging from 10 hours to 20 hours.

* * * * *